(12) United States Patent
Slafer

(10) Patent No.: US 10,879,595 B2
(45) Date of Patent: Dec. 29, 2020

(54) TOOLS AND METHODS FOR PRODUCING NANOANTENNA ELECTRONIC DEVICES

(71) Applicant: MicroContinuum, Inc., Cambridge, MA (US)

(72) Inventor: W. Dennis Slafer, Arlington, MA (US)

(73) Assignee: MicroContinuum, Inc., Watertown, MA (US)

( * ) Notice: Subject to any disclaimer, the term of this patent is extended or adjusted under 35 U.S.C. 154(b) by 0 days.

(21) Appl. No.: 16/565,973

(22) Filed: Sep. 10, 2019

(65) Prior Publication Data

US 2020/0006053 A1    Jan. 2, 2020

Related U.S. Application Data

(60) Division of application No. 15/447,807, filed on Mar. 2, 2017, now Pat. No. 10,580,649, which is a
(Continued)

(51) Int. Cl.
*H01Q 1/24* (2006.01)
*H01L 27/142* (2014.01)
(Continued)

(52) U.S. Cl.
CPC ......... *H01Q 1/248* (2013.01); *H01L 21/0271* (2013.01); *H01L 21/0272* (2013.01); *H01L 21/0273* (2013.01); *H01L 21/0274* (2013.01); *H01L 21/308* (2013.01); *H01L 21/3085* (2013.01); *H01L 21/31144* (2013.01); *H01L 21/32* (2013.01); *H01L 21/32139* (2013.01); *H01L 21/467* (2013.01); *H01L 21/47* (2013.01); *H01L 21/475* (2013.01);
(Continued)

(58) Field of Classification Search
CPC ...... H01Q 1/248; H01L 27/142; H01L 31/108
See application file for complete search history.

(56) References Cited

U.S. PATENT DOCUMENTS 2,706,175 A    4/1955  Licharz
3,551,235 A    12/1970 Bassemir et al.
(Continued)

FOREIGN PATENT DOCUMENTS

CA    2504369    4/2003
DE    2708039    4/1979
(Continued)

OTHER PUBLICATIONS

Kotter et al., "Theory and Manufacturing Processes of Solar Nanoantenna Electromagnetic Collectors," J. Sol. Energy Eng., 132:1-11 (2010).
(Continued)

*Primary Examiner* — Joseph C. Nicely
(74) *Attorney, Agent, or Firm* — Cesari and McKenna, LLP

(57) ABSTRACT

The present disclosure advances the art by providing a method and system for forming electronic devices. In particular, and by example only, methods are described for forming devices for harvesting energy in the terahertz frequency range on flexible substrates, wherein the methods provide favorable accuracy in registration of the various device elements and facilitate low-cost R2R manufacturing.

5 Claims, 13 Drawing Sheets

Related U.S. Application Data continuation of application No. 14/281,583, filed on May 19, 2014, now Pat. No. 9,589,797.

(60) Provisional application No. 61/824,746, filed on May 17, 2013.

(51) Int. Cl.

| | | |
|---|---|---|
| *H01L 21/027* | (2006.01) | |
| *H01L 31/18* | (2006.01) | |
| *H01L 21/467* | (2006.01) | |
| *H01L 21/311* | (2006.01) | |
| *H01L 21/475* | (2006.01) | |
| *H01L 21/3213* | (2006.01) | |
| *H01L 21/308* | (2006.01) | |
| *H01L 21/32* | (2006.01) | |
| *H01L 21/47* | (2006.01) | |
| *H01L 51/00* | (2006.01) | |
| *H01L 31/0352* | (2006.01) | |
| *H01L 31/108* | (2006.01) | |

(52) U.S. Cl.
CPC .... *H01L 27/142* (2013.01); *H01L 31/035209* (2013.01); *H01L 31/108* (2013.01); *H01L 31/18* (2013.01); *H01L 51/0016* (2013.01)

(56) References Cited

U.S. PATENT DOCUMENTS

| | | |
|---|---|---|
| 3,617,351 A | 11/1971 | Long et al. |
| 3,636,147 A | 1/1972 | Rowland et al. |
| 3,926,402 A | 12/1975 | Heenan |
| 4,042,654 A | 8/1977 | Leszyk et al. |
| 4,049,413 A | 9/1977 | French |
| 4,058,430 A | 11/1977 | Suntola et al. |
| 4,102,756 A | 7/1978 | Castellani et al. |
| 4,125,447 A | 11/1978 | Bachert |
| 4,152,447 A | 5/1979 | Bachert |
| 4,181,217 A | 1/1980 | Huls et al. |
| 4,211,743 A | 7/1980 | Nauta et al. |
| 4,286,860 A | 9/1981 | Gursky et al. |
| 4,294,782 A | 10/1981 | Froehlig |
| 4,309,455 A | 1/1982 | Miyagawa |
| 4,362,806 A | 12/1982 | Whitmore |
| 4,366,235 A | 12/1982 | Land |
| 4,372,829 A | 2/1983 | Cox |
| 4,386,145 A | 5/1983 | Gilmour |
| 4,389,973 A | 6/1983 | Suntola |
| 4,426,311 A | 1/1984 | Vander Mey |
| 4,428,761 A | 1/1984 | Howard et al. |
| 4,478,769 A | 10/1984 | Pricone et al. |
| 4,486,363 A | 12/1984 | Pricone et al. |
| 4,514,345 A | 4/1985 | Johnson et al. |
| 4,663,274 A | 5/1987 | Slafer et al. |
| 4,702,792 A | 10/1987 | Chow |
| 4,790,893 A | 12/1988 | Watkins |
| 4,836,874 A | 6/1989 | Foster |
| 4,860,023 A | 8/1989 | Halm |
| 4,871,623 A | 10/1989 | Hoopman et al. |
| 4,923,572 A | 5/1990 | Watkins et al. |
| 5,075,796 A | 12/1991 | Schildkraut et al. |
| 5,077,181 A | 12/1991 | Pan et al. |
| 5,096,401 A | 3/1992 | Tamura et al. |
| 5,147,763 A | 9/1992 | Kamitakahara |
| 5,281,371 A | 1/1994 | Tamura et al. |
| 5,284,548 A | 2/1994 | Carey |
| 5,327,825 A | 7/1994 | Parker |
| 5,330,880 A | 7/1994 | Horigome et al. |
| 5,358,283 A | 10/1994 | Silva |
| 5,408,308 A | 4/1995 | Allegretto et al. |
| 5,475,660 A | 12/1995 | Shikichi |
| 5,480,596 A | 1/1996 | Okubo et al. |
| 5,496,463 A | 3/1996 | Mori et al. |
| 5,502,564 A | 3/1996 | Ledger |
| 5,505,564 A | 3/1996 | Ledger |
| 5,517,338 A | 5/1996 | Vaughn et al. |
| 5,521,030 A | 5/1996 | McGrew |
| 5,524,342 A | 6/1996 | Swain et al. |
| 5,575,961 A | 11/1996 | Kuwabara et al. |
| 5,620,712 A | 4/1997 | Nishino et al. |
| 5,620,769 A | 4/1997 | Wessels et al. |
| 5,627,817 A | 5/1997 | Rosen et al. |
| 5,635,114 A | 6/1997 | Hong |
| 5,639,404 A | 6/1997 | Meier-Kaiser et al. |
| 5,759,455 A | 6/1998 | Kamitakahara et al. |
| 5,759,466 A | 6/1998 | Onuma et al. |
| 5,759,468 A | 6/1998 | Smith et al. |
| 5,872,758 A | 2/1999 | Put et al. |
| 5,874,363 A | 2/1999 | Hoh et al. |
| 5,879,855 A | 3/1999 | Schadeli et al. |
| 5,906,912 A | 5/1999 | Watanabe et al. |
| 5,948,488 A | 9/1999 | Marecki et al. |
| 6,015,599 A | 1/2000 | Keller et al. |
| 6,017,657 A | 1/2000 | Mentz et al. |
| 6,018,383 A | 1/2000 | Dunn et al. |
| 6,045,980 A | 4/2000 | Edelkind et al. |
| 6,106,627 A | 8/2000 | Yializis |
| 6,113,769 A | 9/2000 | Uzoh et al. |
| 6,162,519 A | 12/2000 | Takakuwa et al. |
| 6,163,523 A | 12/2000 | Drecoll |
| 6,183,610 B1 | 2/2001 | Kataoka et al. |
| 6,222,157 B1 | 4/2001 | Langille et al. |
| 6,241,228 B1 | 6/2001 | Chupick |
| 6,258,251 B1 | 7/2001 | Gowans et al. |
| 6,309,799 B1 | 10/2001 | Rueckl |
| 6,337,105 B1 | 1/2002 | Kunieda et al. |
| 6,350,664 B1 | 2/2002 | Haji et al. |
| 6,375,870 B1 | 4/2002 | Visovsky et al. |
| 6,395,136 B1 | 5/2002 | Andersson et al. |
| 6,420,100 B1 | 7/2002 | Trokhan et al. |
| 6,440,333 B2 | 8/2002 | Masuhara |
| 6,482,742 B1 | 11/2002 | Chou |
| 6,540,367 B1 | 4/2003 | Benson et al. |
| 6,551,410 B2 | 4/2003 | Crevasse et al. |
| 6,554,601 B2 | 4/2003 | Ampulski et al. |
| 6,568,931 B2 | 5/2003 | Fujii et al. |
| 6,696,220 B2 | 2/2004 | Bailey et al. |
| 6,703,095 B2 | 3/2004 | Busshoff et al. |
| 6,753,067 B2 | 6/2004 | Chen et al. |
| 6,788,452 B2 | 9/2004 | Liang et al. |
| 6,790,377 B1 | 9/2004 | Cohen |
| 6,833,177 B2 | 12/2004 | Chen et al. |
| 6,861,365 B2 | 3/2005 | Taussig et al. |
| 6,873,452 B2 | 3/2005 | Tseng et al. |
| 6,875,384 B1 | 4/2005 | Whitney |
| 6,849,308 B1 | 5/2005 | Speakman |
| 6,906,779 B2 | 6/2005 | Chan-Park et al. |
| 6,933,098 B2 | 8/2005 | Chan-Park et al. |
| 6,972,893 B2 | 12/2005 | Chen et al. |
| 7,005,468 B2 | 2/2006 | Zang et al. |
| 7,109,118 B2 | 9/2006 | Cohen |
| 7,132,158 B2 | 11/2006 | Brenneman et al. |
| 7,144,942 B2 | 12/2006 | Zang et al. |
| 7,154,451 B1 | 12/2006 | Sievenpiper |
| 7,190,315 B2 | 3/2007 | Waltho |
| 7,195,950 B2 | 3/2007 | Taussig et al. |
| 7,261,950 B2 | 8/2007 | Fleming et al. |
| 7,309,222 B2 | 12/2007 | Tippmann, Sr. |
| 7,389,973 B1 | 6/2008 | Chou et al. |
| 7,470,544 B2 | 12/2008 | Sharma |
| 7,674,103 B2 | 3/2010 | Slafer |
| 7,811,669 B2 | 10/2010 | Fujii |
| 7,833,389 B1 | 11/2010 | Slafer |
| 8,263,433 B2 | 9/2012 | Yeh et al. |
| 8,435,373 B2 | 5/2013 | Slafer |
| 8,535,041 B2 | 9/2013 | Slafer |
| 8,845,912 B2 | 9/2014 | Slafer |
| 8,940,117 B2 | 1/2015 | Slafer |
| 9,039,401 B2 | 5/2015 | Slafer |
| 9,307,648 B2 | 4/2016 | Slafer |
| 9,724,849 B2 | 8/2017 | Slafer |
| 9,845,912 B2 | 12/2017 | Phillips et al. |
| 2001/0038072 A1 | 11/2001 | Aumond et al. |

(56) References Cited

U.S. PATENT DOCUMENTS

| | | | |
|---|---|---|---|
| 2001/0038900 | A1 | 11/2001 | Todori et al. |
| 2002/0100553 | A1 | 8/2002 | Toyoda |
| 2002/0186472 | A1 | 12/2002 | Sloot |
| 2003/0018710 | A1 | 1/2003 | Choi |
| 2003/0059578 | A1 | 3/2003 | Williams et al. |
| 2003/0108710 | A1 | 6/2003 | Coyle et al. |
| 2003/0227683 | A1 | 12/2003 | Sewall et al. |
| 2004/0005423 | A1 | 1/2004 | Dalton et al. |
| 2004/0075396 | A1 | 4/2004 | Okumura et al. |
| 2004/0131718 | A1 | 7/2004 | Chou et al. |
| 2004/0175528 | A1 | 9/2004 | Paulson et al. |
| 2004/0219246 | A1 | 11/2004 | Jeans |
| 2004/0266207 | A1 | 12/2004 | Sirringhauss et al. |
| 2005/0032375 | A1 | 2/2005 | Lockard |
| 2005/0069480 | A1 | 3/2005 | Huang et al. |
| 2005/0106837 | A1 | 5/2005 | Nakai et al. |
| 2005/0112472 | A1 | 5/2005 | Kutsch et al. |
| 2005/0133954 | A1 | 6/2005 | Homola |
| 2005/0150589 | A1 | 7/2005 | Amos et al. |
| 2005/0167276 | A1 | 8/2005 | Stilli |
| 2005/0239935 | A1 | 10/2005 | Kang et al. |
| 2005/0274693 | A1 | 12/2005 | Heidari et al. |
| 2006/0134922 | A1 | 6/2006 | Taussig et al. |
| 2006/0198981 | A1 | 9/2006 | Murata et al. |
| 2006/0283539 | A1 | 12/2006 | Slafer |
| 2007/0169336 | A1 | 7/2007 | Luch |
| 2007/0022096 | A1 | 9/2007 | Slafer |
| 2007/0222096 | A1 | 9/2007 | Slafer |
| 2007/0275556 | A1 | 11/2007 | Bietsch et al. |
| 2008/0190892 | A1 | 8/2008 | Lee |
| 2008/0230511 | A1 | 9/2008 | Kim |
| 2008/0261478 | A1 | 10/2008 | Cok et al. |
| 2008/0292973 | A1 | 11/2008 | Stamper |
| 2008/0303160 | A1 | 12/2008 | Colburn et al. |
| 2009/0130607 | A1 | 5/2009 | Slater |
| 2009/0136657 | A1 | 5/2009 | Slafer |
| 2010/0148159 | A1 | 6/2010 | Burgi |
| 2011/0121258 | A1* | 5/2011 | Hanein ............... H01L 29/0676 257/9 |
| 2011/0140303 | A1 | 6/2011 | Jang et al. |
| 2011/0262860 | A1 | 10/2011 | Wilson |
| 2012/0125880 | A1 | 5/2012 | Slafer |
| 2013/0146117 | A1 | 6/2013 | Brady |
| 2013/0256265 | A1 | 10/2013 | Darling |
| 2014/0110040 | A1 | 4/2014 | Cok |
| 2014/0151935 | A1 | 6/2014 | Slafer |
| 2015/0056816 | A1 | 2/2015 | Sato |
| 2015/0168836 | A1 | 6/2015 | Yamaguchi |
| 2015/0231572 | A1 | 8/2015 | Vankelecom |
| 2015/0372621 | A1 | 12/2015 | Brady |
| 2017/0110688 | A1 | 4/2017 | Slafer |

FOREIGN PATENT DOCUMENTS

| | | |
|---|---|---|
| EP | 0264341 | 4/1988 |
| EP | 0557998 | 9/1993 |
| EP | 0762721 | 3/1997 |
| EP | 0889306 | 1/1999 |
| EP | 0889366 | 1/1999 |
| EP | 1093901 | 4/2001 |
| GB | 2350321 | 11/2000 |
| JP | 57143484 | 9/1982 |
| JP | 60047846 | 3/1985 |
| KR | 616105 | 8/2006 |
| WO | WO 9006234 | 6/1990 |
| WO | WO 1997/14142 | 4/1997 |
| WO | WO 2003/095175 | 11/2003 |
| WO | WO 2004/101855 | 11/2004 |
| WO | WO 2005/072242 | 8/2005 |
| WO | WO 2005/072936 | 8/2005 |
| WO | WO 2006/078918 | 7/2006 |

OTHER PUBLICATIONS

Berland, "Photovoltaic Technologies Beyond the Horizon: Optical Rectenna Solar Cell," ITN Energy Systems, Final Project Report NREL/SR-520-33263, 21 pages (2003).

Sarehraz et al., "Rectenna Developments for Solar Energy Collection," Conference Record of 31st Photovoltaic Specialists Converence, IEEE, pp. 78-81 (2005).

Chou et al., "Imprint Lithography with 25-Nanometer Resolution," Science, 272:85-87 (1996).

International Search Report dated Jul. 29, 2015 from corresponding PCT application No. PCT/US2015/030524.

Xia et al., "Soft Lithography" Angew. Chem. Int. Ed. 37:551-575 (1998).

Rogers et al., "Recent Progress in Soft Lithography," Materials Today, 8:50-56 (2005).

Moonen, "Alternative Lithography Strategies for Flexible Electronics" Ph.D. Thesis, 183 pages (2012).

Li et al., "Self-Aligned High-Resolution Printed Polymer Transistors" Adv. Mater. 23:4107-4110 (2011).

Palfinger et al., "Fabrication of n-and p-type Organic Thin Film Transistors with Minimized Gate Overlaps by Self-Aligned Nanoimprinting," Adv. Mater. 22:1-5 (2010).

Dickey et al., "Transistors Formed from a Single Lithography Step Using Information Encoded in Topography" Small, 18:2050-2057 (2010).

Zeonorfilm, Isotropic Optical Films, Zeon Chemical Ltd., Tokyo Japan (http://www.zeonex.com/) (prnted from the website on May 5, 2015).

Physical & Thermal Properties, Mylar Polyester Film, DuPont Teijin Films, 222367D, http://usa.dupontteijinfilms.com/informationcenter/downloads/Physical_And_Thermal_Properties.pdf (2003).

Comparison of Properties, PEN film, Teijin DuPont Films, http://teijindepontfilms.jp/english/product/hi_film.ftml (printed from the website May 5, 2015).

Physical and Thermal Properties, Kapton Polyimide Films, http://www2.dupont.com/Kapton/en_US/; http://www.upilex.jp/e_index.html (printed from the website on May 5, 2015).

Phiar's Terahertz-Wave Interconnect Technology, Phiar Corporation (2003).

International Search Report and Written Opinion for related PCT Application No. PCT/US07/05151, dated Dec. 17, 2007 17 pages.

International Search Report and Written Opinion for related PCT Application No. PCT/US08/83407, dated Jan. 12, 2009, 7 pages.

International Search Report and Written Opinion for related PCT Application No. PCT/US09/31876, dated Mar. 27, 2009, 7 pages.

International Search Report and Written Opinion for related PCT Application No. PCT/US07/076708, dated Nov. 3, 2008, 14 pages.

Supplementary European Search Report from Corresponding EP application No. 06719038, dated Feb. 5, 2009, 2 pages.

European Search Report from Corresponding EP application No. 06773532.4, dated Apr. 8, 2011, 4 pages.

James J. Cowen,. Et al. "The Recording and Replication of Holographic Micropatterns for the Ordering of Photographic Emulsion Grains in Film Systems" J. Imaging Science 31, 200-107 (1987).

W.D. Slafer et al., "Investigation of Arrayed Silver Halide Grains" J. Imaging Sci. 31, 117-125 (1987).

V. Walworth et al., "Thin Layer Coalescence of Silver Halides" J. Imaging Sci. 31, 108-116 (1987).

Sachin Bet et al., "Thin Film deposition of plastic substrates using silicon nanoparticles and laser nanoforming" Materials Science and Engineering, B. vol. 130, Issues 1-3, Jun. 15, 2006, pp. 228-236.

International Search Report and Written Opinion for related PCT Application No. PCT/US2007/74766, dated May 12, 2008, 10 pages.

Land, "An Introduction to Polavision" Photographic Science and Engineering, 21:225-236 (1977).

Alleman, Gayle "How DVDs Work" Oct. 25, 2000. Howstuffworks.com http://electronics.howstuffworks.com/dvd.htm.

Supplementary European Search Report for related EP Application No. EP04711734, 2 pps, dated Sep. 12, 2008.

(56) References Cited

OTHER PUBLICATIONS

Slafer et al. "Continuous Manufacturing of Thin Cover Sheet Optical Media," SPIE Optical Data Storage, 14 pages, 1992.

\* cited by examiner

TOOLS AND METHODS FOR PRODUCING NANOANTENNA ELECTRONIC DEVICES

RELATED APPLICATIONS

This application is a divisional of U.S. patent application Ser. No. 15/447,807 filed Mar. 2, 2017 entitled TOOLS AND METHODS FOR PRODUCING NANOANTENNA ELECTRONIC DEVICES which is a continuation of U.S. patent application Ser. No. 14/281,583 filed May 19, 2014 entitled TOOLS AND METHODS FOR PRODUCING NANOANTENNA ELECTRONIC DEVICES U.S., which claims priority to U.S. Provisional Patent Application No. 61/824,746 filed May 17, 2013 entitled TOOLS AND METHODS FOR PRODUCING NANOANTENNA ELECTRONIC DEVICES, and is related to Ser. No. 11/337,013 filed Jan. 20, 2006 entitled REPLICATION TOOLS AND RELATED FABRICATION METHODS AND APPARATUS, and Ser. No. 11/471,223 filed Jun. 20, 2006 entitled SYSTEMS AND METHODS FOR ROLL-TO-ROLL PATTERNING, and Ser. No. 11/711,928 filed Feb. 27, 2007 entitled FORMATION OF PATTERN REPLICATING TOOLS, and Ser. No. 11/830,718 filed Jul. 30, 2007 entitled ADDRESSABLE FLEXIBLE PATTERNS, and Ser. No. 12/270,650 filed Nov. 13, 2008 entitled METHODS AND SYSTEMS FOR FORMING FLEXIBLE MULTILAYER STRUCTURES, the entire contents of all of which applications including the Provisional Application are incorporated by reference herein.

FIELD OF INVENTION

The present invention relates generally to the field of forming electronic devices and more particularly to the field of terahertz energy harvesting devices.

BACKGROUND

Rectennas, rectifying antennas that convert incident radiation into electricity, have been investigated for a number of years, and optical rectennas for converting solar radiation into electricity have also been proposed[i,ii,iii]. These devices are generally comprised of two key elements: an antenna array tuned to absorb incident radiation and an array of rectifying elements that converts the antenna's high frequency radiation into low frequency or DC electricity. Proper impedance matching is required to efficiently extract power from these devices, and at radio frequencies (RF), conversion efficiencies of over 85% have been demonstrated[i]. Optical rectennas, also called nanoantennas, nantennas, nanoantenna electronic collectors (NECs), or rectenna solar cells (RSCs), are of particular interest due to their theoretically high efficiencies and ability to harvest longer wavelength radiation than conventional PV cells, such as IR and waste heat.

However, rectennas designed to harvest even longwave IR require antenna elements whose dimensions are commensurate with the radiation to be harvested, typically in the micron regime or below. The small wires that comprise the antenna elements may be even smaller, e.g., in the submicron size range. In addition, in order to rectify electron oscillations in the antenna, the rectifying elements must operate at very high (terahertz) frequencies. For example, to convert 10 µm (longwave IR) radiation, rectenna diodes must operate near 30 THz, and at 300 THz for 1 µm (near IR) radiation.

In order for rectenna devices to become commercially viable, they, like conventional PV modules, must be manufacturable on a scale that allows them to cover a large enough surface area to produce useful electrical power, and at a cost that is competitive with other energy conversion devices. However, current manufacturing technology faces a number of barriers to meeting these requirements.

Nanoscale electronic devices today require a state-of-the-art semiconductor fabrication facility ('fab'). These fabs are built around the use of silicon wafer substrates, typically in the diameter range of 150 mm to 450 mm (6-in to 18-in). The costs of these substrates alone are high enough to make these devices unaffordable, while even the maximum substrate size is far from the square meters require for useful energy harvesting. Additionally, the very high facilities capital expense and relatively low throughput of the required lithography processes prevent wafer-based nanoantenna devices from becoming practical or affordable in the foreseeable future.

Over the last several decades, a relatively new form of patterning has been increasingly applied to lithographic processing, variously called microembossing, imprinting, or more recently, nanoimprint lithography (NIL)[iv,v,vi], it replaces expensive ultra-short wavelength photomask lithography with 'mechanical' patterning capable of forming structures below 10 nm. When carried out using roll-to-roll ('R2R') processing, this type of patterning shows great promise in enabling significantly reduced device cycle times and costs for manufacturing large area nanoantenna solar cells and related devices.

However, while nanoimprinting may be adequate for creating single level patterns, more complex multi-level electronic devices present a problem. One basic semiconductor fab process—pattern registration using mask alignment—cannot be used for forming the multiple levels of aligned patterns at the resolution required for rectenna device formation on most flexible polymeric substrates due to the characteristic dimensional instabilities of plastic films relative to silicon or glass substrates. This can be seen if attempting to align two films independently formed with the exact pattern, even if on the same type of plastic substrate using the same imprint tool—where one area might exhibit very good alignment, the x, y positional errors at nearby locations can show significant non-linear variations, make alignment over large areas impossible by conventional means.

Several approaches have been developed to get around this dimensional stability issue, including various forms of self-aligned lithography and imprinting[vii,viii,ix,x], methods which are particularly useful for roll-to-roll fabrication of flexible electronics. The advantage of self-alignment for polymeric films is that the relative alignment accuracy of the features in the various device layers is established in the master template from which the imprint stamp is ultimately made and is thus effectively independent of the non-uniform dimensional distortions characteristic of virtually all plastic films (U.S. Pat. No. 6,861,365: Method and system for forming a semiconductor device; Taussig; U.S. Pat. No. 7,195,950: Forming a plurality of thin-film devices; Taussig; U.S. Pat. No. 8,263,433: Method of fabricating an active device array and fabricating an organic light emitting diode array Yeh, et al; Sharma: U.S. Pat. No. 7,470,544: Sensor array using SAIL, etc.).

However, these processes suffer from serious limitations: in particular, self-aligned imprint lithography can only produce aligned patterns on material layers (metals, dielectrics) that have been deposited prior to formation of the self-aligned imprint mask. For example, certain circuit requirements, such as wire traces connecting from one layer to another, certain geometries (wire crossings), or material compatibility issues cannot be formed using this approach, while an additional layer of circuit elements cannot be added in registration to a multi-level device structure previously formed using the self-aligned process.

Attempts to get around these constraints are very limited and have serious drawbacks. In self-aligned imprint lithography, forming isolated electrical contacts in a single metal layer requires forming perforations in certain locations of the overlying layers and using chemical etching through these perforations to undercut and eventually separate the underlying metal areas. This approach has the disadvantage of producing an unsupported void space under the dielectric where the metal was removed, which can result in shorting or fracturing of the device if flexed. Also, the undercutting technique is not very controllable and, other than being used to break contact between sections of a conductive layer, cannot be used to produce the well-defined features required in many electronic devices. Finally, "isolating" circuit traces by this technique is limited to open areas where the perforations are accessible for chemical etching.

Thus for R2R processing, the current approaches for fabricating multi-layer electronic devices in general have significant drawbacks. This is particularly problematic for rectenna devices, as they cannot be formed cost-effectively by any current means due to the their submicron alignment requirements and large size (many square feet) requirements. Given the potential utility of such devices in energy and heat harvesting, it is therefore of considerable commercial usefulness to provide an alternative manufacturing method that can overcome these limitations, in particular through the use of roll-to-roll processing for achieving large area, high volume production of low-cost energy harvesting devices. These limitations, as well as others described in the following sections, are overcome by the means of the current disclosure.

SUMMARY OF DISCLOSURE

The present disclosure advances the art by providing a method and system for forming electronic devices. In particular, and by example only, methods are described for forming devices for harvesting energy in the terahertz frequency range on flexible substrates, wherein the methods provide favorable accuracy in registration of the various device elements and facilitate low-cost R2R manufacturing.

For useful background in describing the present disclosure, two key terms—subtractive and additive processing—will be first defined. As widely practiced in the semiconductor device fabrication industry, a subtractive process is generally one in which a photoresist mask is formed over a metal or dielectric material layer on a substrate, and the areas of the material layer revealed through the openings of the mask are removed, using any of several removal techniques (typically plasma or chemical etching). The removal of the photomask ('liftoff') reveals the material layer now having the desired (mask) pattern. A additive process is one in which a photoresist mask is formed on a substrate or layer and the desired metal or dielectric material deposited over the entire mask surface, including the areas of substrate exposed through the mask openings. Again, liftoff of the photomask, this time with the excess overcoated deposited material, reveals the desired material pattern on the substrate.

One embodiment of the disclosure includes a method and system for forming a multi-level device using a combination of both self-aligned subtractive and additive processes. The multi-level polymeric imprint mask ('ML' mask) of the current disclosure contains levels used for both types of processes. Said mask is formed on a substrate comprising multiple pre-deposited layers of thin-film metal and dielectric materials in a specific order to be patterned by the ML mask. Using any of the known methods of subtractive processing, typically plasma or other gas-phase ('dry') etching process or chemical (wet) etching, the areas of the pre-deposited layer exposed through the openings of the ML mask are removed. To transfer the same pattern to additional underlying layers, if desired, the etch process is allowed to continue, modifying the etch formulation as necessary for the removal of each subsequent layer. Depending on the specificity of the selected etch process and the requirements of the pattern, specific material layers can be designed to act as 'stop' layers to terminate the etch process.

For the purposes of the device fabrication method described herein, a subtractive pattern cycle will be defined as consisting of a plasma etch step to modify the openings of the imprint mask by removing one mask height level, thereby revealing an underlying material layer, followed by a second etch step to remove one or more layers of the material exposed through the thus formed openings of the imprint mask. The cycle is repeated until all desired layers have been patterned. This, then, completes the subtractive patterning aspect of the pre-deposited material layers.

In the preferred embodiment of the present disclosure, additional patterned material layers, such as an upper electrode contact layer, are formed in registration with the subtractively-formed material layers by a series of additive process steps now described. As part of the ML subtractive patterning process, an additional mask level is included in the ML mask and an additional opaque material layer is included in the pre-deposited layer stack. This layer does not function as a device layer but rather as an in situ self-aligned dark field photomask. This layer is formed from a metal layer such as Cr or other opaque material, and if the former, where the layer immediately overlying this layer is also a metal, an electric isolation (dielectric) layer is included in the pre-deposited stack to prevent shorting. The Cr or other opaque material mask formed by the self-aligned subtractive process is then used in a self-aligned additive process to form a desired upper patterned layer, accurately aligned to the previously formed device layers.

This is accomplished by coating a radiation curable liquid over the previously patterned structure and exposing this liquid through the openings in said Cr (opaque) mask, causing the liquid to solidify only in those areas exposed to the radiation to which the liquid is sensitive. The non-solidified portion of the liquid is washed away with appropriate solvent. In a second step, the original patterned device, along with the newly formed ('hard') polymeric structure, is then planarized with a protective ('soft') non-radiation sensitive polymer. A plasma etch step is used to etch back any excess (first or second) polymer material, as necessary, and thereby expose the material feature to which the added electrode layer is to be in contact. The layer to be added, in this example a metal for an upper electrode, is now blanket deposited by any of several means known to the art (vacuum deposition, CVD, electroless, etc., alone or in combination). The excess deposited metal is then removed by a liftoff step, using a solvent designed to dissolve the soft polymer.

Further, it may be advantageous for certain applications, such as for a more transparent device, to remove the self-aligned opaque mask layer, therefore it is an aspect of the present disclosure to provide a release layer between the flexible substrate and the photomask layer (the first layer of the pre-deposited stack), and using a bonding adhesive, to transfer the complete device to a receiving substrate (e.g., glass, plastic, metal; rigid or flexible), thereby exposing the photomask layer for removal by etching.

From the above discussion, it may be appreciated that the stack of pre-deposited materials, including metals and dielectric materials, will be optically opaque, thus the very desirable use of radiation curing to form the ML imprint mask can only be carried out if the imprint tool itself is transparent. Forming a durable but transparent ML imprint tool presents a problem for large volume production, since the typical options for such tools, including etched glass, polydimethylsiloxane (PDMS) or other transparent polymer, are typically either very expensive, very fragile, or both, particularly when formed into a cylinder, as typically used for R2R manufacturing. It is therefore another embodiment of the method and process of the present disclosure to provide an ML imprint tool that is accurate, readily formed, inexpensive and suitable for production. In this embodiment, an original master template having the multi-level geometry is formed by any of a number of known techniques (e-beam or laser lithography, etc.). The master template is converted into durable Ni imprint tooling by known processes, such as precision Ni electroforming as practiced by the CD.DVD manufacturing industry. Such Ni imprinting tools (also known as "shims"), when formed into a drum, can be used to produce a large quantity (i.e., rolls) of high quality, inexpensive but accurate polymer replicas. These replicas, wrapped and bonded (for example, with an optically clear pressure sensitive or other adhesive) to a transparent cylindrical mandrel, are then used in the ML imprinting process to form the ML imprint mask used in the previously described process. The significance of this embodiment is that the plastic ML tool is extremely inexpensive and moderately durable: it can be made from robust UV resin on a polyester or other support film, or formed directly in a low adhesion plastic, for example a cyclic olefin copolymer such as Zeonor[xi]. Being inexpensive allows this plastic imprint tool (stamper) to be easily replaced whenever necessary, even after runs as short as a single production shift. Another advantage of this embodiment is that the plastic ML tool, being transparent, can itself be made from durable and relatively inexpensive Ni tooling, thereby allowing large quantities of the 'disposable' plastic stamper to be made inexpensively.

In addition to the embodiment of the method and process of the present disclosure described above for radiation imprinting, in yet another embodiment of the present disclosure, the radiation process may be replaced by a polymer coating process whereby a thin polymer layer, such as cellulose acetate butyrate, polycarbonate, acrylate, or other polymeric material, is coated over the topmost of the pre-deposited material layers. Instead of radiation (UV, visible, etc.) solidification (e.g., by cross-linking) of a liquid material applied at the imprint station, said polymer can be coated "off-line", as part of the working substrate mentioned above. It is an aspect of the current method that this layer can be imprinted thermally, by softening with heat prior to or during contact with the imprint drum, but in a preferred embodiment, through the use of a solvent or solvent/diluent mixture suitable for softening the polymer layer for imprinting. This has the advantages over radiation and thermal imprinting that is does not require elevated temperatures, which can damage sensitive structures or substrates, and does not require optical transparency of either the working substrate or the imprint drum, thereby enabling the use of low-cost, durable Ni imprint tooling. It does require, however, a separate coating step.

In another embodiment of the method and process of the present disclosure for operation in higher temperature environments (such as may be advantageous in harvesting long wavelength energy, including waste heat), the electronic devices made by the present disclosure can be formed on metal foils, such as stainless steel, etc., or flexible glass. Since the pre-deposited material stack formed by vacuum deposition cover the entire surface of the substrate, the processes used will not be in direct contact with the substrate and will not require modification.

The uniformity and edge acuity, etc., of the patterned material layers depend upon the quality of the imprinted mask, and this in turn requires a very precisely controlled polymer layer to insure precise etch removal of each of the mask levels: if a mask layer is too thick and not entirely removed, un-etched material will result, causing possible shorts between lines. Conversely, if the layer is too thin, it may prematurely etch and undesired material removal will result. It is therefore another embodiment of the method and process of the present disclosure to provide a ML mask formed by means of precisely controlling the distributing of mask-forming polymer through the use of a computer-controlled multi-nozzle ink jet heat array applicator. Such an applicator can produce a high-resolution pattern of very uniform fine spatially controlled dots of imprint polymer in a pattern that is synchronized in spatial with the pattern on the imprint drum on the moving web. Contact with the imprint stamp causes the drops to merge into a uniform film, which in turn provides a highly uniform residual polymer layer. Spatial control of the fluid distribution allows the optimal volume of resin to be delivered to each part of the ML stamp pattern, thus for example no polymer is applied to areas where no masking is required, or conversely, more fluid is deposited in areas where the ML stamp has features that require a larger fluid volume. High uniformity imprint residue layer thickness results in higher plasma etch consistency, more efficient use of resist, and faster etching (less organic material to remove). (W. Dennis Slafer U.S. Pat. No. 9,724,849: FLUID APPLICATION METHOD FOR IMPROVED ROLL-TO-ROLL PATTERN FORMATION).

It is another embodiment of the present invention to further improve the uniformity of the ML mask, while also reducing manufacturing process cost and complexity, through the use of semi-transparent nanoimprint tools[xii] (US20120125880A1: TOOLS AND METHODS FOR FORMING SEMI-TRANSPARENT PATTERNING MASKS SLAFER) to eliminate the residue layer typically formed as a by-product of the nanoimprint process. This reduces the number of plasma etch process steps and eliminates a potential source of defects—the under- or over-etching of the mask residue layer (equivalent to the well-known 'scum' layer in semiconductor photoresist processing).

In yet another embodiment of the present disclosure, a means to further improve the formation of the ML mask is by using a non-heating, energy efficient and non-polluting solid-state radiation sources for curing the ML-forming liquid. Conventionally, radiation curing is accomplished using a short wavelength (mercury lamp, etc.) UV sources. This, however, has a number of drawbacks, particularly in that said sources produce very large amount of unusable heat and UV radiation (i.e., outside of the wavelength band that contributes to imprint mask curing), wasting energy (increasing costs) and in many cases forming ozone as a by-product that, along with eye danger, poses potential threats to workers. Replacement of these radiation sources in the present disclosure with low current, narrow band (<10 nm) output solid-state LED light sources operating in the long wavelength UV/visible spectral region, and sensitizing the photocurable mask formulation to solidify at the peak wavelength output of such diodes (e.g., 390 nm diode manufacturer Infinilux, Inc., Commerce Calif.), allows virtually all radiant energy to be fully utilized, enabling the R2R process to run faster while avoiding the common thermal substrate distortion common with conventional high-powered UV lamps.

Other aspects and advantages of the present disclosure will become apparent from the following detailed description, taken together with the accompanying (not to scale) drawings, illustrating by way of example the principles embodied in the present disclosure.

DETAILED DESCRIPTIONS OF EXEMPLARY EMBODIMENTS OF DISCLOSURE

Detailed Description of Figures

The following description is presented to enable one of ordinary skill in the art to make and use the invention disclosed herein, and it will be appreciated that the exemplary embodiments and principles described in the present invention may be equally applied to other types of electronic devices. This section describes in detail the methods of the current invention for a R2R process capable of large-scale, low cost manufacturing for rectenna and other nanoantenna devices.

Figure 1:
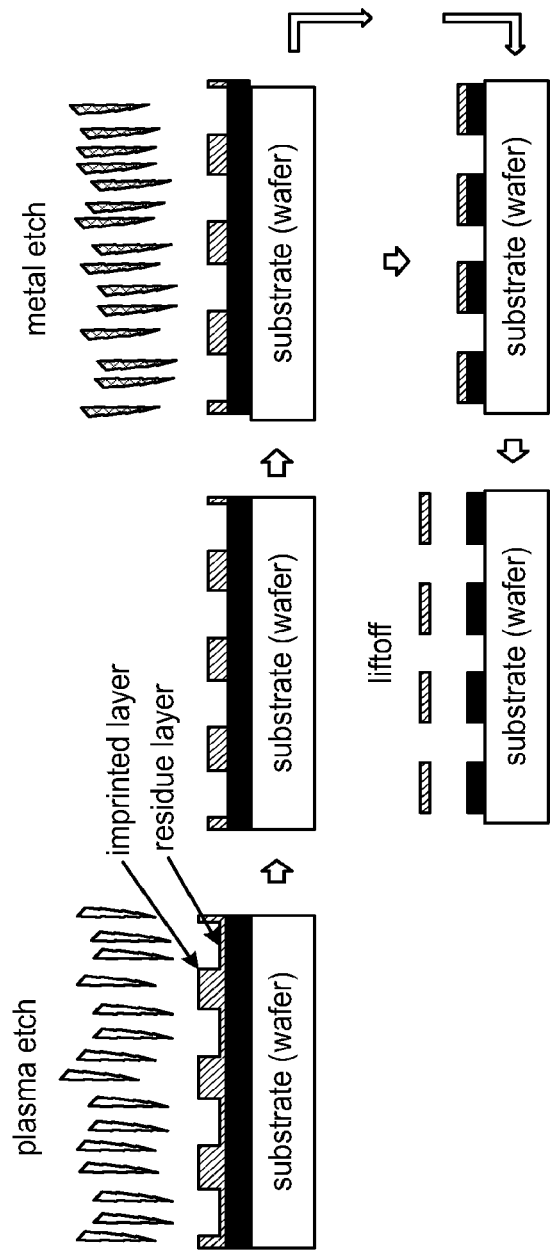
FIG. 1 shows schematic drawings of subtractive patterning process using an imprinted mask [PRIOR ART].
Figure 2:
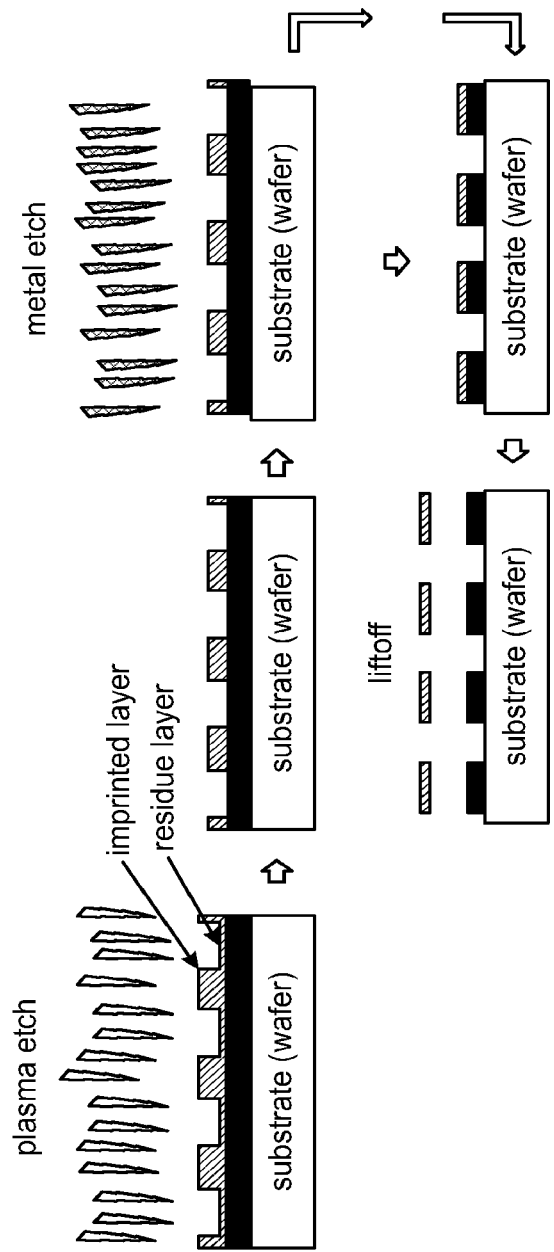
FIG. 2 shows schematic drawings of additive patterning process using an imprinted mask [PRIOR ART].

For ease of explanation, the method for forming nanoantenna devices and the like have been broken into a series of individual operations or steps:

Step #1: coat metal and dielectric layer stack on polymer substrate on pre-coated substrate Step #2: form multi-level self-alignment mask, by nano-imprinting etc., on pre-coated substrate Step #3: use subtractive processing with ML mask and pre-deposited layers to carry out multiple [material layer+mask level etch] cycles until all layers have been patterned Step #4: use additive processing to form additional material layers using self-aligned internal photomask Step #5: (optional): remove internal photomask and/or transfer device to different substrate A detailed description of the sequence of individual process steps for several embodiments is now given. Given in FIGS. 1 & 2 are methods known to the art (described above) for using an imprinted polymer mask to carry out a subtractive process for removing material and an additive process for depositing material, respectively, to form patterned material patterns.

Figure 3:
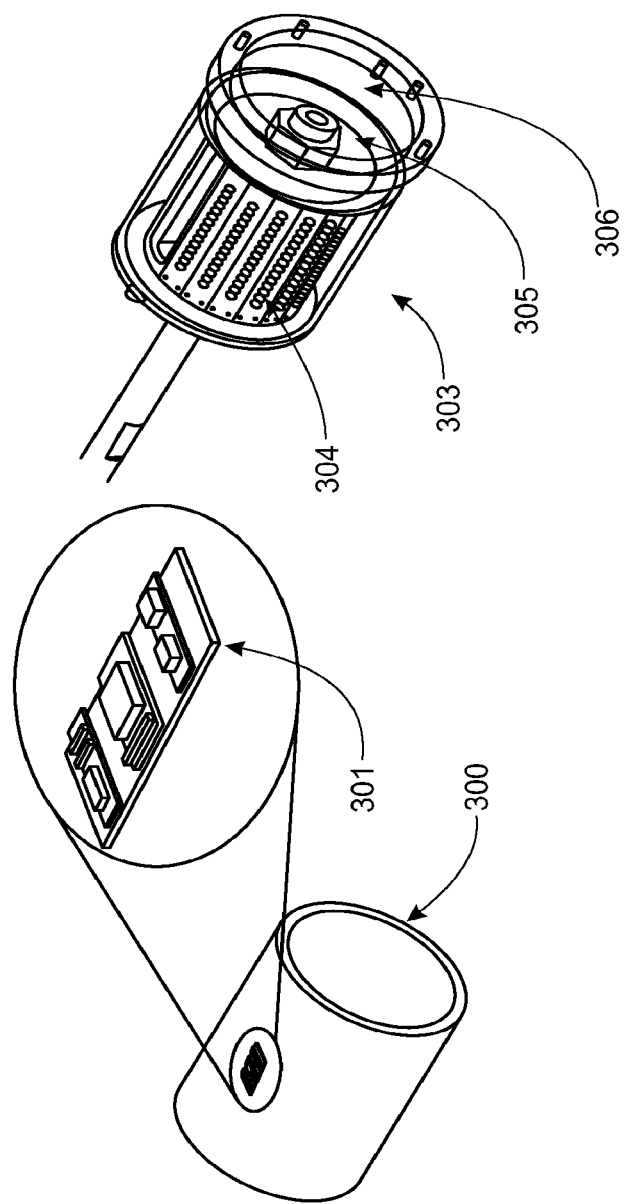
FIG. 3 is a schematic showing a transparent drum with bonded flexible stamp for imprinting a multi-level pattern. Also shown is a stationary internal LED radiation source for curing imprint fluid through transparent R2R drum tool.
Figure 4:
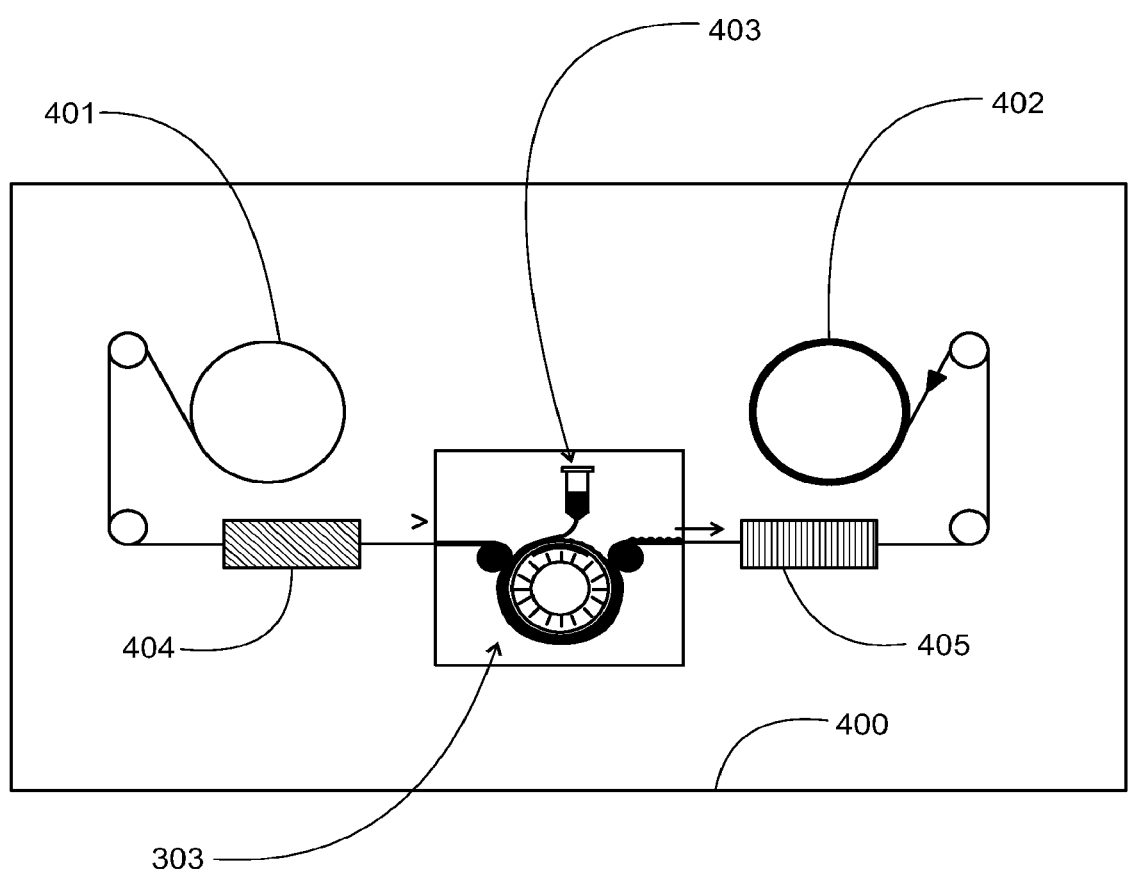
FIG. 4 is a schematic drawing of a machine for roll-to-roll (R2R) formation of ML imprint masks.

FIG. 3 shows a transparent patterning drum (300) comprising a transparent sleeve (glass or plastic) bonded to a flexible ML polymeric film layer (301) used in a roll-to-roll imprint machine (c.f. FIG. 4, related applications incorporated herein) developed for replicating such stamp patterns. Also shown is an exposure device 303 that is mounted inside transparent drum 300 and includes a stationary LED radiation source 304 mounted on heat sink 305 and using a roller bearing mechanism 306 for allowing the transparent drum stamp to rotate circumferentially around the stationary light source, allowing the radiation from the LED source to cure and harden the imprint polymer that is laminated between the drum surface and the opaque carrier film.

FIG. 4 shows a schematic of a R2R machine that incorporates the transparent imprinting drum 303 with internal exposure (c.f. FIG. 3) for forming the ML imprint mask on the pre-deposited flexible substrate. Machine is enclosed in clean module 400, with unwind station 401 and rewind station 402, representational fluid applicator 403, cleaning station 404, and optical pattern measurement station 405. One embodiment of a method by which the electronic devices of this disclosure may be produced by R2R means is discussed in detail below.

R2R Processing: Multi-Layer Pre-Deposition

Flexible substrates used in the R2R machines described in the current disclosure include PET (polyethylene terephthalate, or 'Mylar'), a substrate used commonly in R2R manufacturing because of its physical strength, high optical quality, chemical resistance and low cost. It is available in a wide range of thicknesses (4 μm to 750 μm), surface finishes, and surface treatments (e.g., adhesion promoting sublayers, etc.). While the typical maximum working temperature of PET is approximately 150° C.[xiii], a variant named PEN (polyethylene naphthalate, 200° C.[xiv]), as well as other commercially available films (polyimide films[xv] such as Kapton, metal foils, flexible glass) are available where process or usage conditions require a higher working temperatures and may also be used in the present process.

R2R ML Mask Formation

The embodiments of the present disclosure, as previously described, may be beneficially carried out using one or more R2R processes discussed in this section.

In a first R2R machine pass, all of the layers to be patterned by the ML imprint mask are coated in a specific order, typically by sputter or other vacuum coating, although any of the means known to means are possible as well. This coated film, along with the layers subsequently added or processed, will be referred to as the "working substrate". In FIG. 4, the spool of working substrate 401 is fed into the imprint zone 303, after passing through cleaning zone 404 to remove particulate or other contamination. The working substrate enters the imprint zone, where the liquid monomer resist for the ML mask is applied, either to the drum or incoming substrate, as a controlled thin layer by ink jet or other precise coating means. Because the pre-deposited layers cause the substrate to be optically opaque, one embodiment of the ML mask formation process—radiation curing—must be done through a transparent imprinting stamp (tool), shown in FIG. 3 as sleeve 300 with imprint layer 301. In this embodiment, a solid state light source 303 consists of a stationary LED array 304 attached to heat sink 305 around which rotates the transparent imprint sleeve by means of bearing assembly 306 (FIG. 3).

Figure 5:
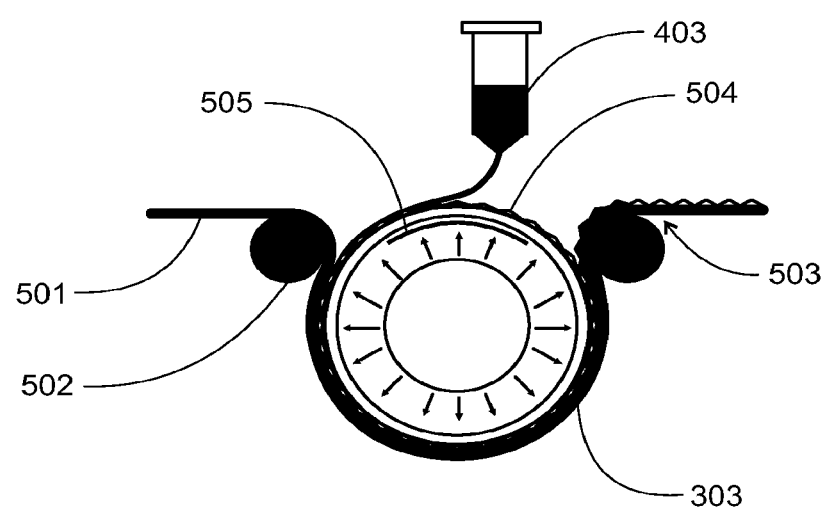
FIG. 5 is a detailed view of a component of a R2R machine for forming ML imprint masks.

The imprint zone is shown in detail in FIG. 5, wherein working substrate 501 is brought in contact with the patterned surface 504 of imprinting sleeve 303. The fluid used to form the ML mask is applied by source 403 (ink jet nozzle array or other), while light shield 505 prevents premature curing of liquid. The use of digitally controlled imprint fluid dispenser (ink jet nozzle array) can optimize the patternwise distribution of imprint fluid to improve uniformity and fluid usage. Elastomeric input nip roller 502 presses the working substrate against the pattern surface (504) while under exposure to radiation from the internal LED source. Now patterned substrate 503 exits the imprint zone and travels through an inspection station 405 (FIG. 4) where an optical measurement system (camera or laser based) evaluates the quality of the imprinted layer. As previously seen (FIG. 4), it travels to the take-up spool 402, with the rewound working substrate now consisting of an imprinted multi-level resist mask adhered to a multilayer thin film stack on a flexible substrate.

R2R Plasma and Chemical Etching

The next R2R machine pass (not illustrated) removes the polymer residue from the imprint process (where this step may be eliminated by the use of semi-transparent imprint mask tools, incorporated herein by reference) or selectively removes one or more of the pre-deposited layers in reverse order of their deposition. Removal is carried by the techniques of plasma or chemical etching known to the art, where the plasma process is used for removing polymeric material, such as the mask residue and/or polymer mask levels. The etch process my include a series of steps with individual etchants optimized for one or more of the pre-deposited layers, thus several etch passes may be required as necessary, although it is desirable to utilize etchants or etchant blends that will process multiple layer per pass. These steps are carried out by chemical, plasma, or a combination of etching means. In the present embodiment, a R2R machine for chemical etching includes a series of chemical immersion and rinse baths, each with the appropriate chemistry to remove a target material, and various types of end-point detection known to the art are used to control the etch process to eliminate under- or over-etching of pattern elements.

After all layers have been patterned through the first ML mask level by the above means, the mask itself is etched in height to reveal the second mask level, which reveals another set of mask openings though which another set of etching operations is carried out. This cycle is repeated until all of the pre-deposited layers have been patterned. The preferred embodiment of this disclosure includes the patterning of an opaque layer, such as Cr, that has been included as one layer of the pre-deposited stack. Because this layer is formed by the ML mask and is therefore properly aligned with the other patterned layers of the device, it will enable the critical formation of additional, precisely aligned materials layers that could not be formed by the conventional self-aligned ML imprint patterning process alone.

Exposure Through Internal Photomask

After the pre-deposited layers of the working substrate have been completely patterned, the R2R process shown in FIG. 4 is again used, this time to planarize the patterned film using a curable liquid used to form a structural support for the added pattern layers. The film is transported into the imprint zone 303, but in this case the transparent sleeve with the ML film overlay has been replaced by a smooth, patternless transparent drum sleeve (i.e., 300 without 301 in FIG. 3). The film is brought into contact with this clear drum so that the uncoated side of the working substrate is against the sleeve, allowing the radiation from 304 to pass through the internal photomask before exposing the applied fluid. A temporary plastic film or the glass sleeve itself can be used to provide a smooth or textured surface for this process. After exposure, the planarized film exits the exposure station and (after removing the temporary strip sheet, if used), the unexposed fluid is rinsed off with appropriate solvent and dried.

Soft Polymer Application In a next step, a coating process is used to again planarize the patterned film surface, this time with a 'soft' (non-radiation curable) polymer that will temporarily protect the device structures during a subsequent material deposition step (not shown). Application of this soft polymer layer may be by solvent coating or thermal laminated or other appropriate means. At this stage, the working substrate with the soft polymer top layer is rewound onto a take-up spool.

Figure 10:
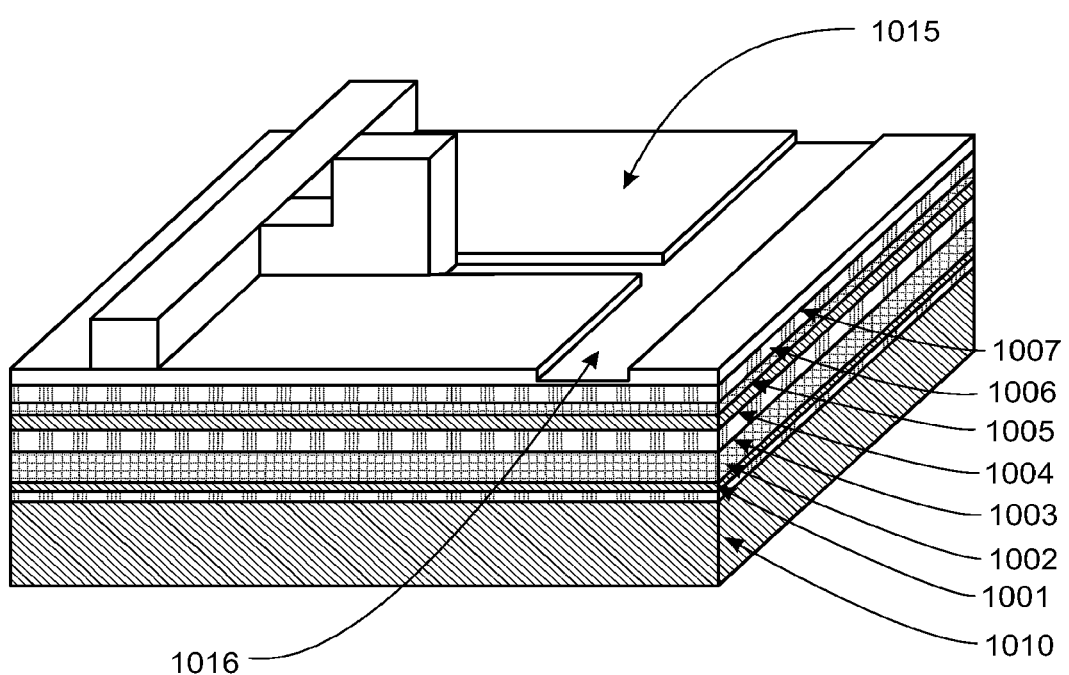
FIG. 10 is a 3-D representation of a structure similar to that given in FIG. 7 showing a multi-level polymer imprint mask on a multilayer coated substrate, where the device structure includes additional metal layers.
Figure 11:
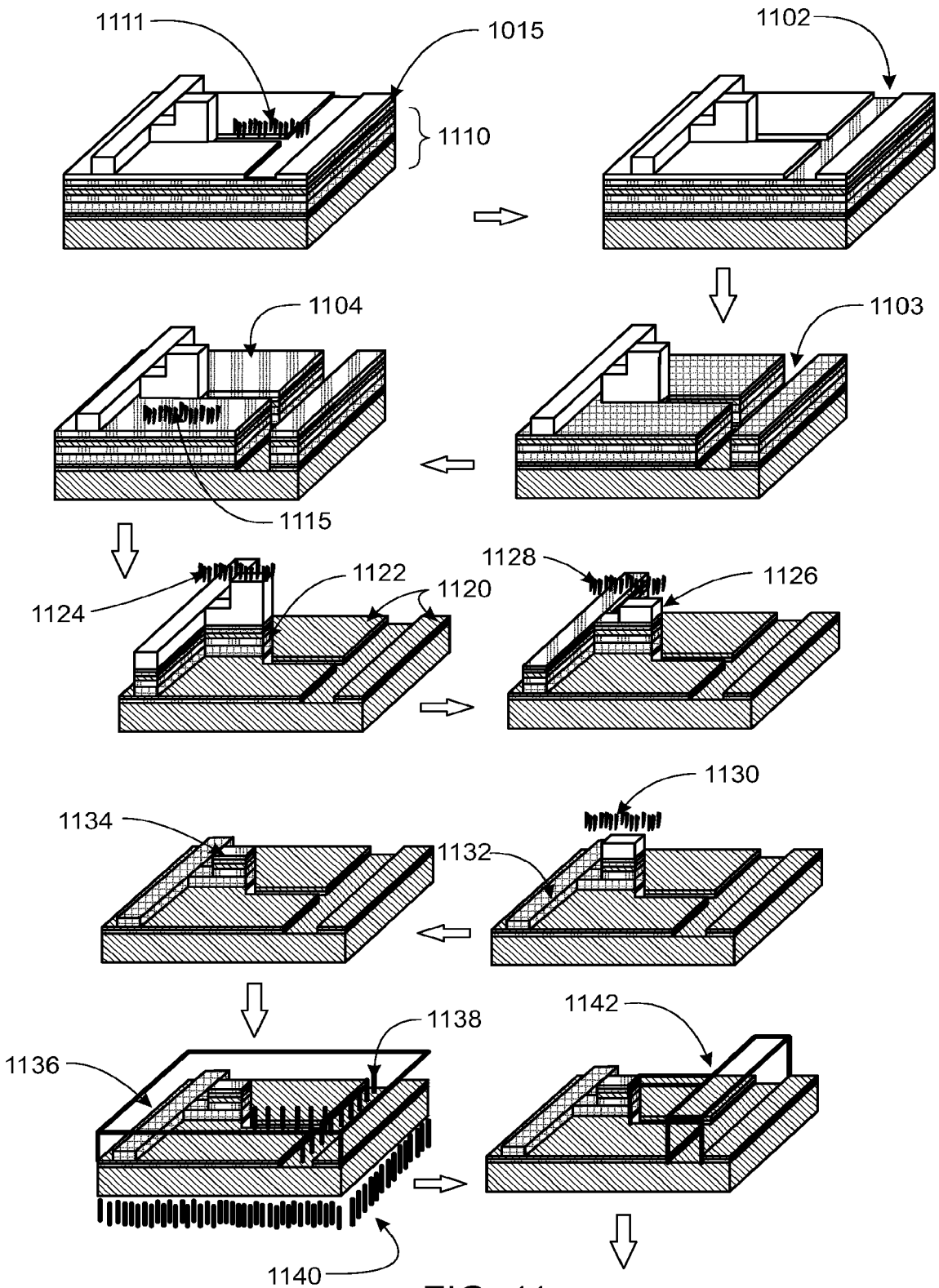
FIGS. 11-13 are a series of 3-D representations of one embodiment of a process for making nanoantenna solar cells using the material stack shown in FIG. 10.

Additive Layer Deposition In the next step, a R2R vacuum process is used to remove excess soft (and hard) polymer, as necessary, to both expose and clean the topmost material layer—formed by the previous subtractive self-aligned patterning process—to which the deposited layer will contact (this aspect of the disclosure is described in more detail in FIGS. 10-11). In a sequential vacuum operation, preferably without breaking vacuum, the top material is deposited after the etch-cleaning step. This sequence will assure good electrical contact between the previously patterned material layer and the layer being deposited.

Liftoff & Final Steps The next R2R step, carried out under atmospheric conditions in a machine such as used for the R2R chemical etching previously described, the excess soft polymer along with excess material from the previous vacuum step is removed by exposing the working substrate to a solvent that is appropriate to dissolve the soft polymer, thereby removing said polymer and excess vacuum deposited material, followed by rinse and drying steps.

At this point it may also be desirable to remove the internal opaque photomask layer in order to provide a more transparent material for certain applications or to transfer the device from the working substrate to another substrate, such as one suitable for a higher temperature working environment (e.g., metal foil, flexible glass, polyimide, etc.). This is done by incorporating a release layer into the pre-deposited stack, between the substrate and the photomask layer. Such a layer, as well known to the art, can be activated by heating, chemical exposure, or mechanical separation. In a R2R process (not shown), the working substrate fed from a supply spool to a laminating station where the patterned side is adhesively bonded to a suitable carrier film, after which the release layer is activated and the original substrate delaminated. The now-exposed internal mask layer is chemically removed (etched), as well as the now-exposed electrical insulation layer, if desired. The adhesive used in this lamination step can also serve as encapsulants to prevent chemical, moisture, oxygen attack, where necessary. Similarly, the now exposed surface of the device may also be coated with an encapsulants material for similar reasons.

The individual steps of the above-described R2R process will now be described in a detailed fashion, using discrete coupons as explanatory examples, and it should be noted that the devices of this disclosure can be made by either R2R or batch processes.

This completes the description of the series of R2R processes that, as one embodiment of the current disclosure, provides a means of large area production of electronic devices with precisely aligned submicron features, such as terahertz energy harvesting devices and the like.

In the following figure descriptions, the individual elements of the fabrication methods of the current disclosure will be described in a step-by-step basis.

Figure 6:
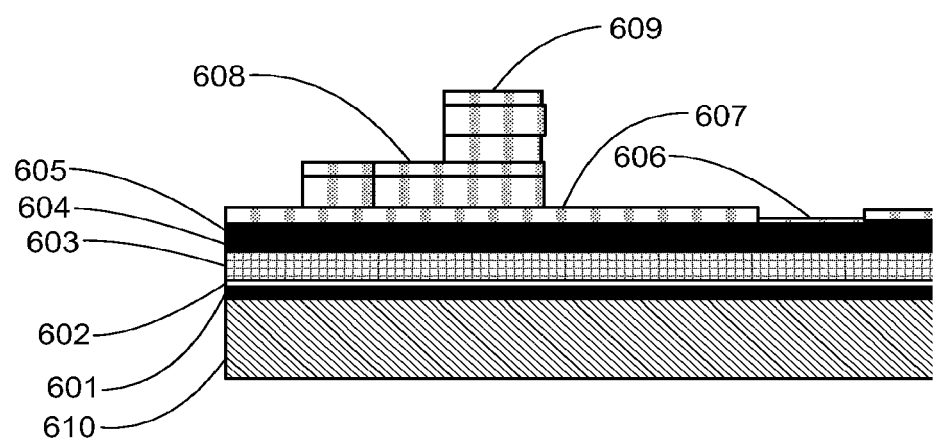
FIG. 6 is a cross-sectional sketch of a multi-level polymer imprint mask on a pre-deposited multilayer stack on a substrate.

In FIG. 6 is shown a cross-sectional sketch showing the initial patterning levels and mask for producing a rectenna device based on an array of metal nanoantennas with metal-insulator-insulator-metal (MIIM) rectifying elements, this being but a single example of possible electronic devices and nanoantenna-based devices that can be formed by the means of this process. The metal-insulator1-insulator2 stack (603-604-605, respectively) together form part of a MIIM diode tunneling junction, a device known to the art as being capable of rectifying the high frequency radiation absorbed by the nanoantenna$_{xvi}$. In this example, a substrate 610 has been pre-coated with a sequence of layers, including a first chrome layer 601, and electrical insulation (SiO2) layer 602, a metal electrode layer 603, a first thin diode insulator 604 and a second thin diode insulator 605. The metal electrode could be any appropriate diode metal, such as Ni or Nb, and the insulators could be oxides of these or other metals or other appropriate insulator materials. Over upper insulator 605 is formed the 3-level imprint mask comprising a polymer residue layer 606, a first mask level 607, a second mask level 608, and a third mask level 609, where the height of each acts to separate the levels and allow removal of each level in turn by plasma etching. It should be noted that different metals and multiple layers of metals can be used for the antenna metal and for the diode electrode metal, where here for the sake of simplicity is represented by only one metal layer 603 for the lower antenna metal and lower diode electrode. In addition, other metals and/or dielectric layers may be added, such as might be required to act as transition or barrier or isolation layers, including for the insulators nitrides, carbides, oxides, etc. At this point in the process, it should be noted that the top electrode/antenna metal is not yet part of the stack.

Figure 7:
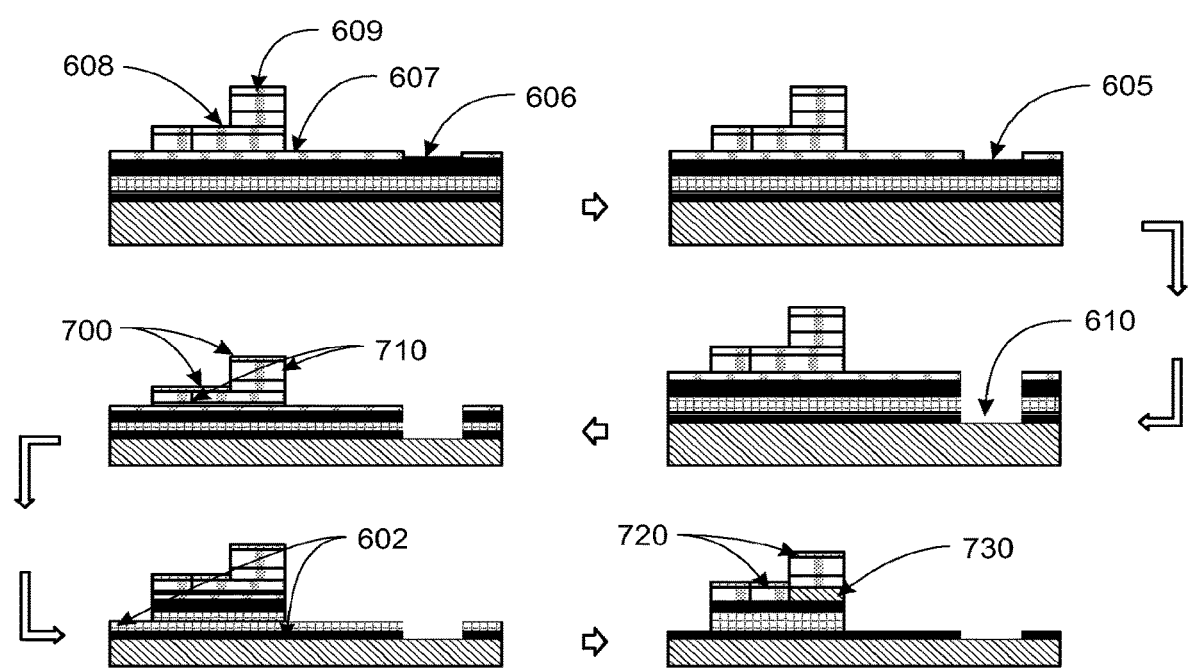
FIG. 7 is a set of cross-sectional sketches showing the series of steps used in the formation of a nanoantenna device.

FIG. 7 illustrates in cross-section the steps used to convert the pre-deposited material layers of FIG. 6 into the patterned metals and insulators that make up the lower part of the device stack, although by changing materials, thicknesses and stack ordering, the concepts of this disclosure can be applied to other types of electronic devices. The process begins with the removal of the polymer residue (606 in step 1 [upper left]) to expose the underlying upper insulator layer 605 in step 2, then using plasma etching or wet (chemical) etching as known to the art, or a combination thereof, to remove all of the deposited stack of layers exposed through the mask openings (604, 603, 602, 601 of FIG. 6), where the etch process and chemicals are adjusted, as necessary, in sequence to carry out the desired removal of all material layers. This etch sequence stops when the substrate 610 is reached (step 3). In step 4, plasma etching (usually by an oxygen-argon or other gas plasma process known for removing organic material) removes the lowest mask level (607), resulting in mask 710 remaining. The material removed from the mask, 700, is shown in lighter gray in this sketch. The removal of each step of the multi-level mask reveals new areas of the pre-deposited stack, which are in turn etched by one or more selective etch processes that do not affect the polymer mask and are designed to stop at electrical insulation layer 602 (step 5), thereby defining a pattern in lower metal 603. This completes the patterning cycle for mask level 1, and for the purposes of this discussion, a sequence of mask etching followed by material etching will be referred to as an etch cycle. Step 6 of FIG. 7 shows the result of the plasma removal of mask level 2, forming new mask profile 730 by the removal of material shown grayed out, 720.

Figure 8:
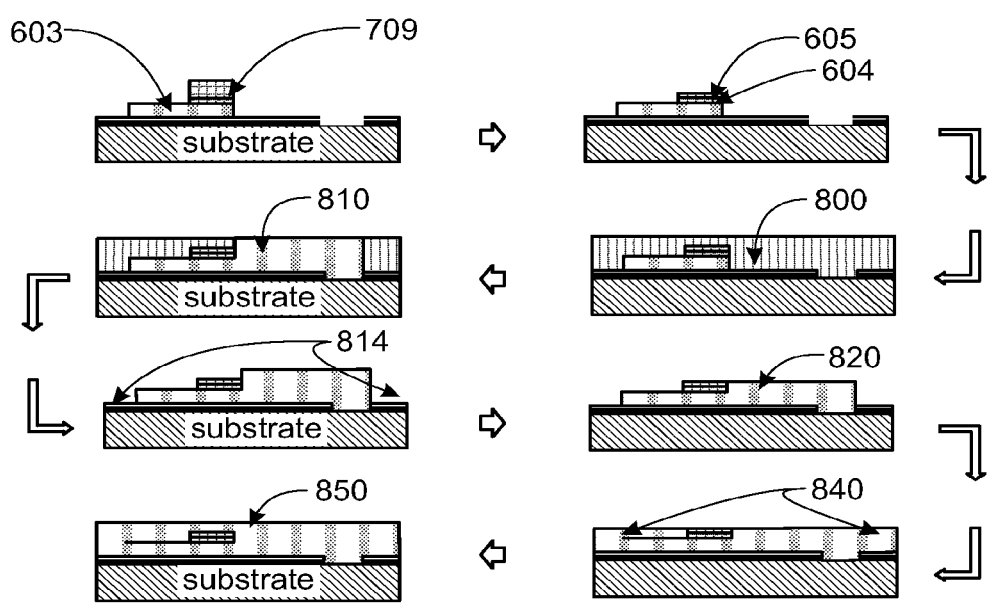
FIG. 8 is a set of cross-sectional sketches, continuing the processes from FIG. 7, which shows the additive process steps used in the formation of a nanoantenna device.

Continuing the process in FIG. 8, the result of the second material layer etch process is shown (step 1, top left), which patterns the two insulator layers, shown as 604, 605 on lower patterned metal layer 603. The last remaining parts of the mask, 709, is removed by plasma etch (step 2), completing the subtractive steps and setting the stage for the additive processing.

In step 3 of FIG. 8, the top surface of the device is planarized using a radiation-curable liquid (800, step 3) with lamination to a temporary cover sheet film (not shown). The laminated structure is illuminated through the bottom substrate such that radiation passes through the openings in the chrome mask layer 610 (FIG. 7), causing the polymer to harden only in the areas of the mask openings (810, step 4). The strip sheet is removed and the remaining (uncured) polymer is removed, typically by solvent rinse, defining the plateau 810 to be used for subsequent metal deposition and exposing areas 814 (step 5). Any hardened material 810 above the top level of the upper insulator (605) can be plasma etched to reduce this height (step 6, 820). A second planarization layer (step 7, 840) is applied over the device surface, this time using a non-crosslinkable ('soft') polymer, such as acrylic or polycarbonate or CAB (cellulose acetate butyrate, etc.), PVA (polyvinyl alcohol), etc. This layer is used to temporarily protect the other parts of the device from the upcoming metallization step. Another etch cleaning step (not shown) is used to expose and clean the upper insulator 605, after which one or more layers of upper electrode/antenna metal(s), shown as single layer 850 in step 8) are deposited by vacuum deposition, plating, or combination deposited over the cleaned surface. In order to define the pattern of the upper metal in layer 850, a liftoff process in which solvent is used to remove the excess soft polymer and excess overcoated deposited metal, also revealing the lower electrode/antenna metal layer 603. At this point the MIIM structure has been formed.

Figure 9:
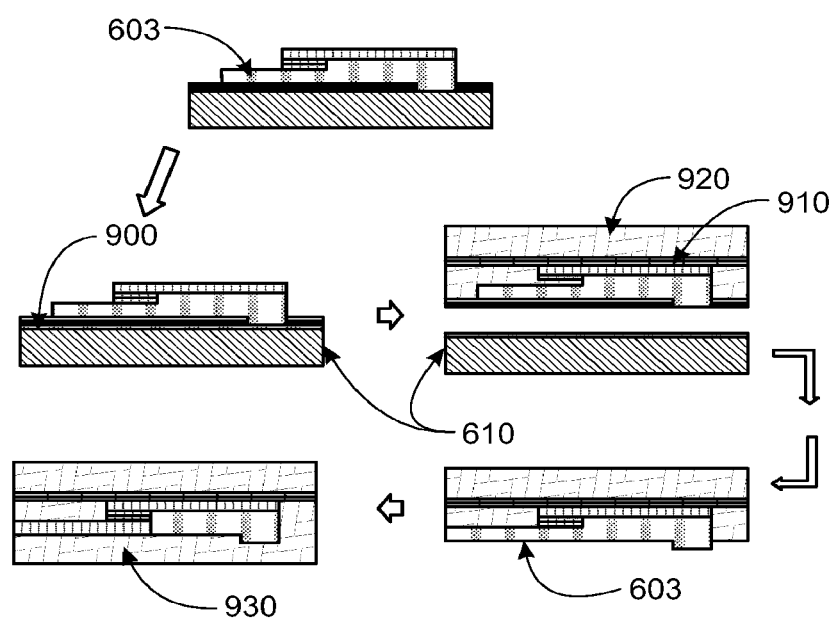
FIG. 9 is a set of cross-sectional sketches, continuing the processes from FIG. 8, which shows the final set of steps used in the formation of a nanoantenna device.

Additional optional steps can be used to either apply a protective overcoat to the MIIM structure, to transfer the device to another substrate, or to remove the opaque internal mask to make the structure more transparent. To accomplish these objectives, in FIG. 9 is shown an additional layer 900 (step 2) in the original layer structure. Layer 900 is a release layer, as described above. In step 3, the upper surface of the MIIM device is laminated to a transparent substrate 920 using an adhesive 910, preferably a radiation cured adhesive for easy and rapid processing. After delamination (step 4), substrate 610 (FIG. 6) is separated from the device, which is now bonded to substrate 920 (step 3). At this point (step 4) metal additive mask layer 601 and insulator 602 can be removed by plasma or wet etching, thereby exposing the bottom metal/antenna layer 603 (FIG. 6). This layer can then be protected by addition of coating 930 (polymer or inorganic), shown in step 5. The resultant device comprises one of many possible embodiment of a nanoantenna/MIIM diode array for rectification of incident the radiation.

FIG. 10 shows a 3-D perspective view of a structure similar to that shown in FIG. 6, except that in this embodiment, two additional metal layers are incorporated, thus the pre-deposited stack is as follows (starting from the top and moving down):

Metal2 (1007)
Insulator2 (1006)
Insulator1 (1005)
Metal1 (1004)
Antenna Metal ('Ma', 1003)
Insulator (1002)
Photomask metal (1001)
Substrate (1010)

The ML imprint mask and the residue layer resulting from certain forms of imprint processing are shown as 1015 and 1016, respectively. Regardless of the additional layers in the stack relative to the device in FIG. 6, the sequence of processing steps is essentially equivalent to that described previously. The use of 3-D perspective in the description of this embodiment is also meant to aid the reader in better understanding the process.

Beginning with the structure shown in FIG. 10, the sequence of steps used to pattern the pre-deposited layers and prepare for additive processing is given in FIG. 11. Note that as in previous illustrations, the sequence starts at the upper left of the illustrations and each step sequentially follows the arrows. ML mask 1015 is first formed over pre-deposited stack 1110 and subsequently plasma etched (1111), using a reactive ion etch process with argon and oxygen gas, resulting in the top metal (M2) being revealed (1102) in step 2. The third step shows the culmination of a sequence of etch steps 1103, either chemical or plasma, or a combination of both, that patterns layers M2, I2, I1, M1 and Ma, but stops at the insulation layer 1002 (FIG. 10). Step 4 shows the device after removal of the next mask level, which reveals M2 layer 1104. A next series of etch steps 1115 remove all remaining exposed portions of M2, I2, I1, M1, and Ma, the result of which is illustrated in step 5, which shows the metal/insulator stack 1122 and exposed electric insulator layer 1120. Mask etch process 1124 is used to remove the next mask level, resulting in upper metal M2 (step 6) being revealed.

A selective etch sequence 1128 is used to remove portions of the exposed metal/insulator stack not protected by mask level 1126 down to the M1 layer, where the results are shown in step 7. Also shown in that step is the last element of the multi-level mask, which has been removed in step 8, revealing the upper metal contact layer M2.

In step 9 (bottom left), the surface shown in step 8 is planarized by a radiation-curable liquid 1138 laminated between said device and a planar surface (plastic film or glass plate, not shown for clarity). Radiation exposure 1140 of the liquid through the patterned metal layer results in the solidification of the irradiated liquid, 1142, followed by solvent rinse of un-crosslinked liquid, reveals a structure that will become a support or plateau for deposition of an additional metal layer by additive processing.

Figure 12:
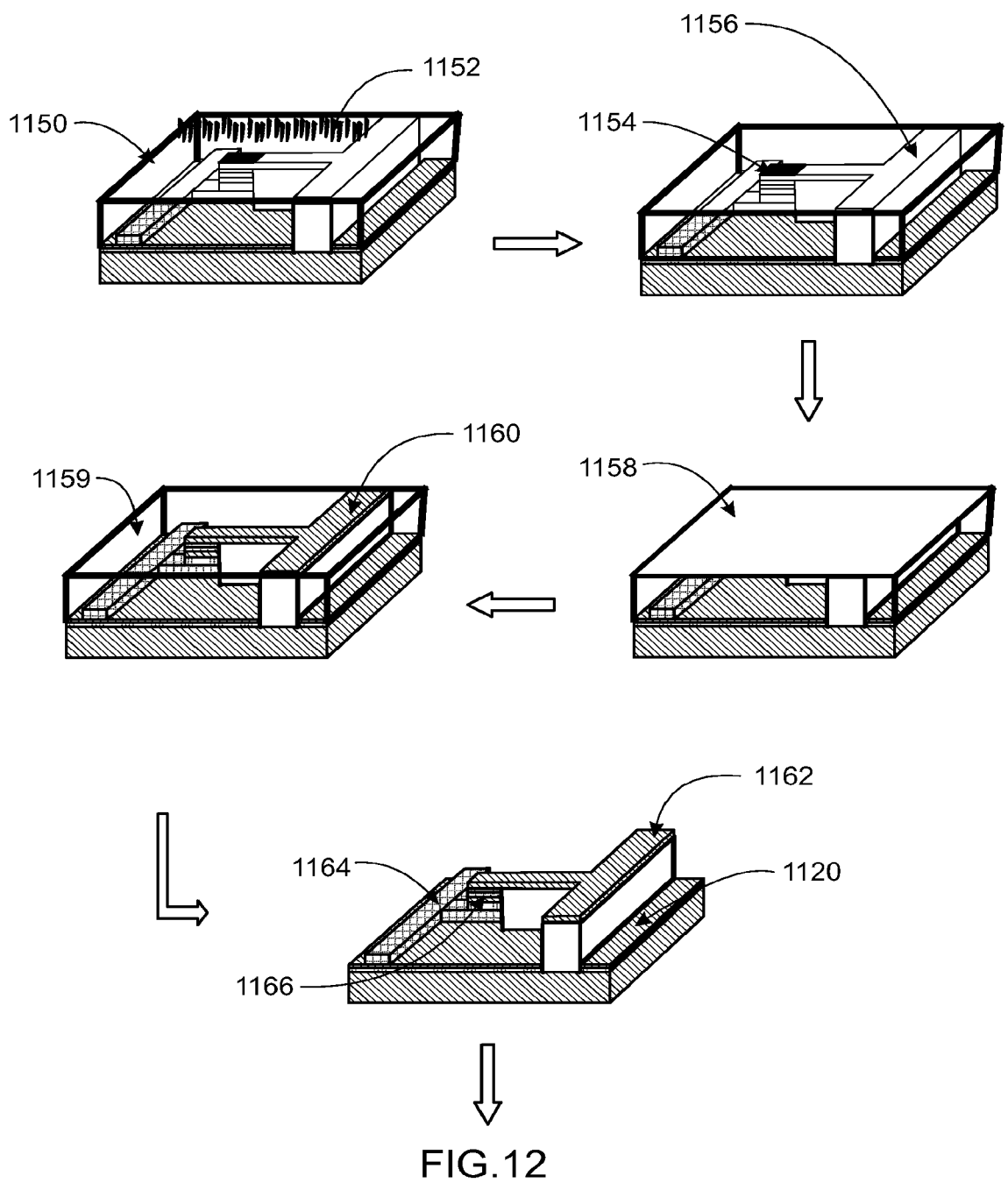

FIG. 12 shows the next part of the additive process in which another planarizing liquid polymer 1150, this not radiation curable, is coated over the device and solidified, and etch process 1152 is then used to removed excess polymer and reveal the upper surface of M2 layer, shown in step 2 as 1154, and the exposed and cleaned plateau as 1156. This aspect of the current disclosure is significant because the etch process, carried out in vacuum, also serves to clean and prepare the upper metal contact 1154 for subsequent coating, also in vacuum and done preferably without breaking vacuum between these steps.

In step 3, a metal layer 1158 is blanket then deposited over the top surface by any of a metal deposition means (sputtering preferred, but also e-beam, thermal vacuum deposition, chemical vapor deposition (CVD), electroplating, electroless deposition, atomic layer deposition [ALD]$^{xvii,xviii}$). A liftoff process is carried out in step 4, wherein a solvent is used to dissolve the soft polymer layer 1159, removing this material along with excess metal from the deposition process, thereby producing patterned metal layer 1160.

The finished device structure is given in step 5, showing the lower electrical insulation layer 1120 that isolates the underlying metal photomask layer, the lower metal antenna/contact metal 1164, the metal/insulator MIIM stack 1166, and the top metal antenna/contact layer 1162.

Figure 13:
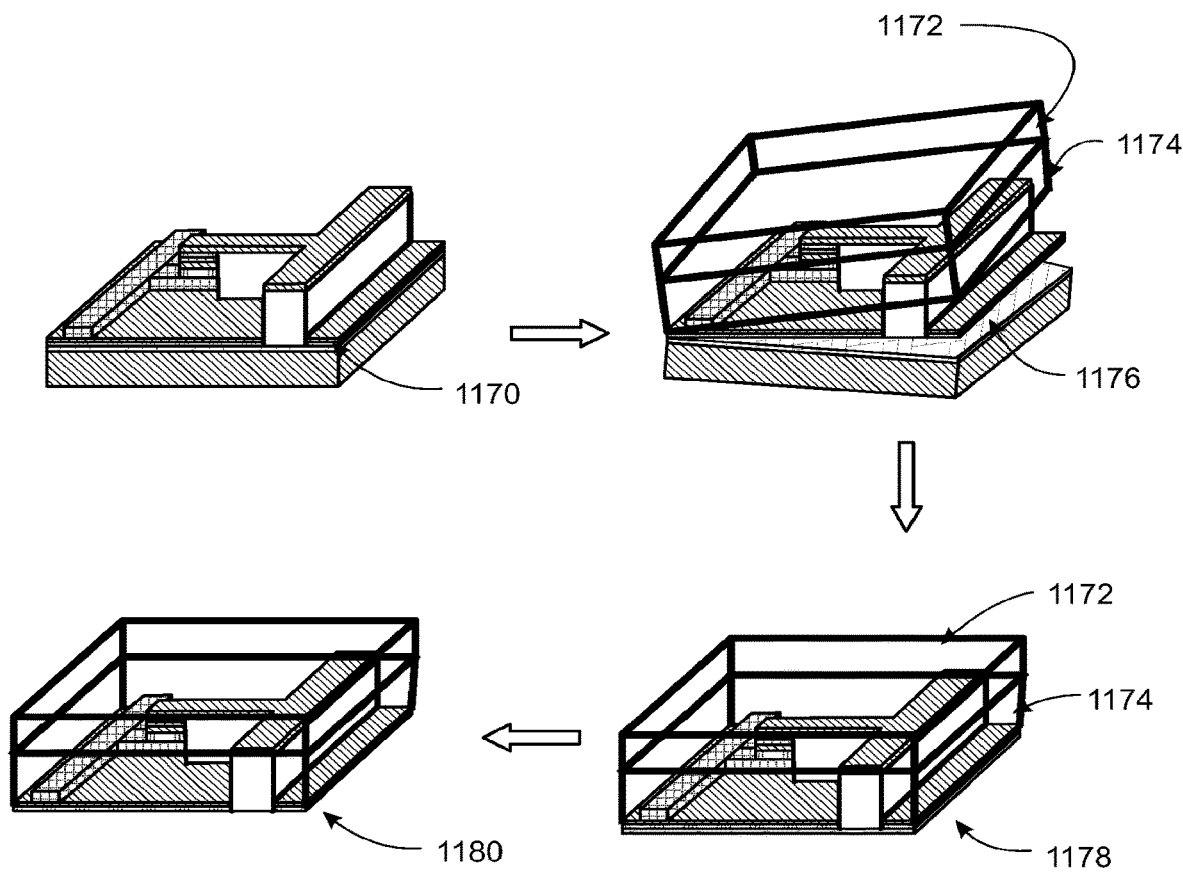

In certain situations it has been mentioned that it may be desirable to have a more transparent device, or to transfer the device to another substrate, such as metal foil for use in a higher temperature environment. These options are illustrates in FIG. 13, wherein the original device stack now includes an additional layer 1170 that acts as a release layer to enable separation of the full device stack from the substrate. Step 2 in FIG. 13 illustrates the lamination of a carrier film 1172 (a plastic film, metal foil, or flexible glass substrate) with an appropriate adhesive 1174 (UV cure, thermal, reactive or any such adhesive) to the patterned device, followed by the separation at location 1176 of the original substrate, with the result (step 3) showing the device now inverted with respect to substrate 1172, and opaque photomask layer 1178 (layer 1001 in FIG. 10) thereby being revealed. Step 4 shows the full structure after chemical removal of 1178 and exposed electrical insulator layer 1180 (1002 in FIG. 10), which can be similarly removed or left in place. The exposed surface can be electrically connected to other devices and/or further encapsulated for protection.

The structure formed in this process incorporates lower and upper metal nanoantenna and contact layers and a (generic) MIIM rectifying diode array in contact with the nanoantenna array, all of which has been formed by self-aligned techniques that do not require mask alignment or other processes problematic for flexible substrates and by processes that can readily be carried out using R2R machines.

It should be clear from the various embodiments described above that many types of electronic devices can be formed by the methods, or variations thereof, of the present disclosure.

REFERENCES

[i] "Theory and Manufacturing Processes of Solar Nanoantenna Electromagnetic Collectors," *J. Sol. Energy Eng.* 132(1), 011014 (Jan. 5, 2010)

[ii] B. Berland, "Photovoltaic technologies beyond the horizon: optical rectenna solar cell," ITN Energy Systems, Final Project Report NREL/SR-520-33263, 1 Aug. 2002.

[iii] M. Sarehraz, K. A. Buckle, T. Weller, E. Stefanakos, S. Bhansali, Y. D. Goswami, and S. Krishnan, Rectenna developments for solar energy collection, Conference record of 31st Photovoltaic Specialists Conference, Jan. 3-7, 2005, IEEE

[iv] Chou, S. Y.; Krauss, P. R.; Renstrom, P. J. (1996). "Imprint Lithography with 25-Nanometer Resolution". *Science* 272 (5258)

[v] Xia, Y.; Whitesides, G. M. (1998). "*Soft Lithography*". *Angew. Chem. Int. Ed. Engl.* 37 (5): 551-575.

[vi] Rogers, J. A.; Nuzzo, R. G. (2005). "Recent progress in soft lithography". *Materials Today* 8 (2): 50-56.

[vii] P. F. Moonen "Alternative Lithography Strategies For Flexible Electronics", Ph.D. thesis, University of Twente, Enschede, Netherlands, Jul. 4, 2012.

[viii] S. Li, W. Chen, D. Chu, S. Roy, *Adv. Mater.* 2011, 23, 4107-4110.

[ix] U. Palfinger, C. Auner, H. Gold, A. Haase, J. Kraxner, T. Haber, M. Sezen, W. Grogger, G. Domann, G. Jakopic, J. R. Krenn, B. Stadlober, *Adv. Mater.* 2010, 22, 5115-5119.

[x] M. D. Dickey, K. J. Russell, D. J. Lipomi, V. Narayanamurti, G. M. Whitesides, *Small* 2010, 6, 2050-2057.

[xi] Zeon Chemical Ltd, Tokyo Japan (http://www.zeonex.com/)

[xii] W. Dennis Slafer, Semi-Transparent imprint tools US2012/0125880A1 "Tools and Methods for Forming Semi-Transparent Patterning Masks"

[xiii] "Physical & Thermal Properties—DuPont Teijin Films", DuPont Teijin Films, 222367D, June 2003; http://usa.dupontteijinfilms.com/informationcenter/downloads/Physical_And_Thermal_Properties.pdf

[xiv] "Comparison of properties—PEN Film—Teijin DuPont Films"; http://www.teijindupontfilms.jp/english/product/hi_film.html

[xv] http://www2.dupont.com/Kapton/en_US/; http://www.upilex.jp/e_index.html

[xvi] MIIM reference

[xvii] T. Suntola, J. Antson, "Method for producing compound thin films", U.S. Pat. No. 4,058,430, (1977).

[xviii] T. Suntola, A. Pakkala, S. Lindfors, "Apparatus for performing growth of compound thin films", U.S. Pat. No. 4,389,973 (1983).

What is claimed is:

1. A rectifying antenna system for converting electromagnetic radiation into electricity, the system comprising:

a. a film substrate having a first electrically conductive layer that is planar and adjacent to the film substrate, wherein the first electrically conductive layer is configured as a first antenna structure with associated contact leads;

b. a first insulator layer that is planar and in contact with at least one portion of the first electrically conductive layer, wherein an interface between the first electrically conductive layer and the first insulator layer forms a first diode junction having a first pattern;

c. a second insulator layer overlying the first insulator layer, wherein an interface between the first and second insulator layers forms a second diode junction having a second pattern, wherein the second pattern is similar to the first pattern;

d. a second electrically conductive layer overlying the second insulator layer, wherein an interface between the second electrically conductive layer and the second insulator layer forms a third diode junction having a third pattern;

e. a standoff structure that is insulating and complementary to the antenna structure component, wherein the standoff structure is essentially planar and in direct contact with at least one part of the second electrically conductive layer and has approximately the same height relative to the film substrate; and f. a third electrically conductive layer in contact with an upper surface, distal from the film substrate, of the standoff structure and adjacent to the third diode junction, thereby forming a second antenna structure with associated contact leads, wherein the second antenna structure is complementary to the first antenna structure;

g. wherein all of the layers of (a) through (f) are configured as a layered stack of essentially planar layers.

2. The system of claim 1, wherein the insulator layers are sufficiently thin and capable of allowing electron tunneling.

3. The system of claim 1, wherein the insulator layers and adjacent electrically conductive layers form a conductor-insulator-conductor tunneling diode.

4. The system of claim 1, wherein the electrically conductive layer nearest the substrate includes transparent and opaque areas and for functioning as a photomask.

5. The system of claim 1, wherein a transparent area has the approximate shape of the standoff structure.

* * * * *